(12) United States Patent
Reiss et al.

(10) Patent No.: US 7,245,013 B2
(45) Date of Patent: Jul. 17, 2007

(54) SUBSTRATE BASED IC-PACKAGE

(75) Inventors: Martin Reiss, Dresden (DE); Kerstin Nocke, Dresden (DE)

(73) Assignee: Infineon Technologies AG, Munich (DE)

( * ) Notice: Subject to any disclaimer, the term of this patent is extended or adjusted under 35 U.S.C. 154(b) by 100 days.

(21) Appl. No.: 11/190,068

(22) Filed: Jul. 26, 2005

(65) Prior Publication Data
US 2007/0023891 A1 Feb. 1, 2007

(51) Int. Cl.
*H01L 23/48* (2006.01)
*H01L 23/52* (2006.01)
*H01L 29/40* (2006.01)

(52) U.S. Cl. .............................. 257/738; 257/E23.069
(58) Field of Classification Search ................ 257/737, 257/738, 782, 783, 692, 778, 686, 779; 438/118
See application file for complete search history.

(56) References Cited

U.S. PATENT DOCUMENTS

| | | | |
|---|---|---|---|
| 6,048,755 A * | 4/2000 | Jiang et al. | 438/118 |
| 6,413,799 B1 * | 7/2002 | Lam | 438/113 |
| 7,125,748 B2 * | 10/2006 | Grigg et al. | 438/118 |
| 7,145,225 B2 * | 12/2006 | Lee | 257/686 |

* cited by examiner

*Primary Examiner*—Luan Thai
*Assistant Examiner*—Dana Farahani
(74) *Attorney, Agent, or Firm*—Slater & Matsil, L.L.P.

(57) ABSTRACT

A semiconductor component comprises a substrate that includes wiring on a first surface. A chip is mounted on a second surface of the substrate by a die attach, the second surface opposite the first surface. A bond channel in the center of the substrate allows for electrical connection of contact pads on the wiring with bond pads arranged in a center row on the chip by wire loops. A housing made of a mold compound surrounds a backside of the chip and parts of the substrate adjacent to the wiring. The semiconductor component further comprises a rigid prepreg layer covering, as well as the wiring of the substrate and the prepreg layer being provided with openings. Each opening is arranged in such a manner that the contact pads are accessible, and solder balls are mounted on each of the contact pads through the openings.

20 Claims, 2 Drawing Sheets

SUBSTRATE BASED IC-PACKAGE

TECHNICAL FIELD

Generally to packaged integrated circuits and in more particular to a substrate based integrated circuit package.

BACKGROUND

An IC-package, such as a ball grid array package, includes a substrate having a first surface and a second surface. A chip is mounted on a surface and ball pads, conducting traces and solder masks on the other surface wherein the conducting traces are disposed in between the adjacent ball pads, and are covered by the solder mask. A portion of each of the ball pads is also covered by the solder mask. The solder mask is produced by photolithographic structuring and developing of an epoxy resin.

The solder mask includes openings positioned in the area corresponding to the ball pads, wherein the opening exposes an opening of the surface of the substrate, the ball pad and a portion of the side wall of the wall pad. The chip is disposed on the second surface of the substrate and is sealed and encapsulated by the insulated material such as a mold compound. The solder balls are disposed on the first surface of the substrate and are positioned at the openings of the ball pads. Additionally, the solder balls are electrically connected to a portion of the side wall of the ball pads disposed at the ball pad openings. Such an IC-package is described in US Patent Application No. 2002/0111054 A1, which is incorporated herein by reference.

A similar semiconductor package is known from in US Patent Application Publication 2003/0227083, which is incorporated herein by reference. This package exhibits an increased resistance force of the solder ball of a BGA package mounted on a PCB against shear stress.

The solder mask used in the prior art has already been omitted on the side of the substrate. But there is still a ring of solder mask on the side, which causes problems due to the uneven height of the solder mask ring (different bond line thickness). The unevenness of the solder mask ring is process related at the supplier's side.

The uneven distribution of the soldermask on the chipside and on the ballside of the substrate cause a high warpage of the substrate, which is very critical for assembly processes, like wire bonding or die bonding (i.e. multi chip packages). So, the die thickness or the mold cap clearance (thickness of the mold layer above the die surface) must be adjusted for each product individually.

Furthermore, the main reason for the reduced reliability goes back to the presence of the solder mask. The solder mask takes up a high load of humidity in the soaking during the preconditioning. Therefore pre-baking steps during assembly process are necessary to release the humidity during the curing process without forming bubbles (very long curing process with a special ramp up) and the curing processes must be adjusted to each product individually.

SUMMARY OF THE INVENTION

In one aspect, the invention improves the assembly performance of a substrate based IC-package.

In another aspect, the invention reduces the humidity uptake of the substrate, during the assembling processes and to minimize the efforts for controlling.

In a further aspect, the invention reduces the warpage of the substrate.

In a first embodiment, a substrate based IC-package with a substrate is provided with a wiring on one of its sides, which is covered by a rigid prepreg layer. The prepreg layer is provided with openings, each arranged in such a manner that the contact pads are free accessible, and solder balls mounted on each of the contact pads through the openings.

The prepreg layer completely replaces the solder mask used in the prior art and the pre-bake processes within the assembly can be skipped.

In other embodiments, a substrate based IC-package with a substrate which is provided with a wiring on both sides, wherein the wiring on both sides of the substrate is covered by a rigid prepreg layer. The wiring opposite to the chip side is provided with openings each arranged in such a manner that the contact pads are free accessible, and solder balls are mounted on each of the contact pads through the openings.

Each of the openings in the prepreg layer can have a v-shaped cross section with the result, that the solder balls can be assembled easier.

In case that the diameter of the openings in the prepreg layer are smaller than the diameter of the contact pads, the Prepreg layer secures the contact pads on the substrate.

The openings in the substrate can have a circular or an angular circumference.

Furthermore, the prepreg layer is connected with the substrate by laminating and can consist of the same material as the substrate. Such a material can be a glass fibre fixed with an epoxy resist.

It is also possible to laminate a prepreg layer on both sides of the substrate. This reduce the warpage of the matrix strip (substrate) as well as the warpage of the package.

A very good height control of the prepreg layer guarantees a stable bond line thickness.

The adhesion of the mold compound to the prepreg surface is better than to the solder mask, used in the prior art and a general process flow is possible for all products, without adjustments to the individual product or using very long curing ramps.

At least a stack of dies can be mounted on the substrate with a redistribution layer between each of the stacked chips.

DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
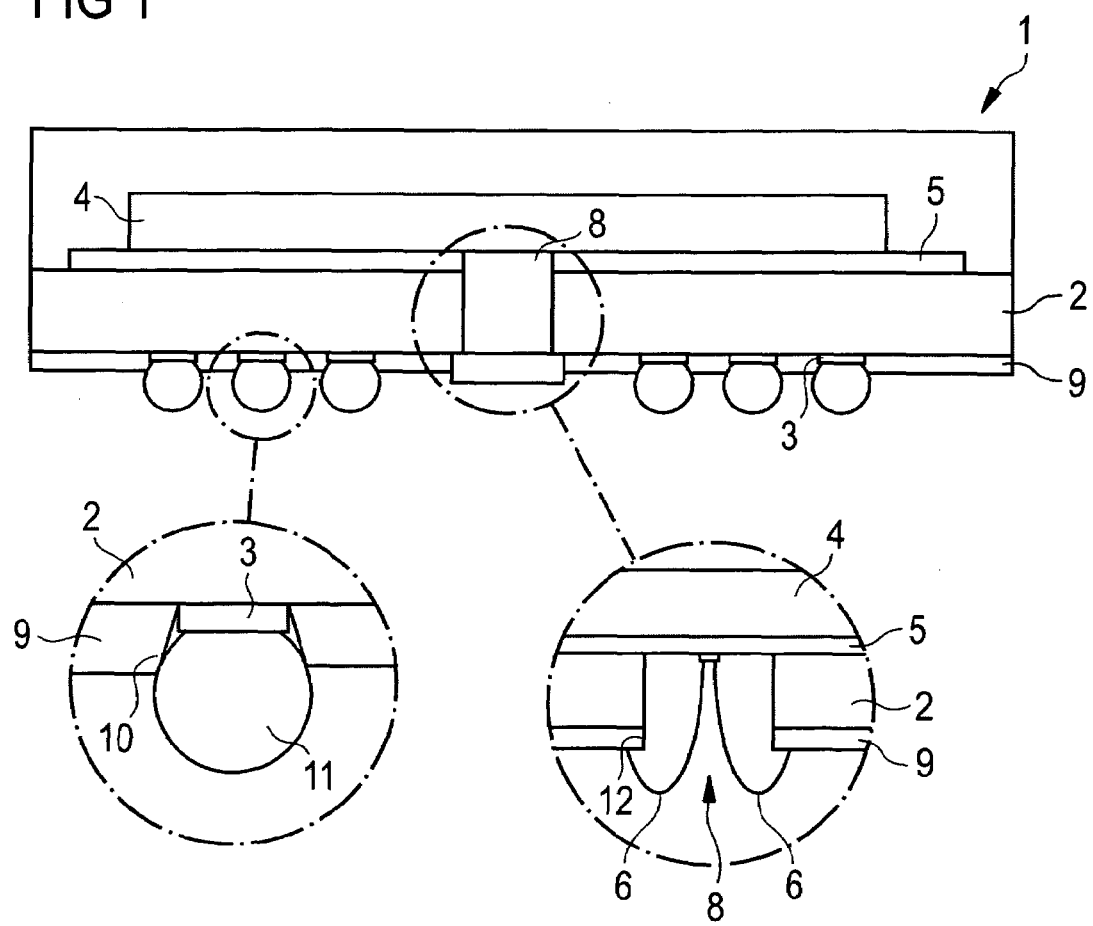
FIG. 1 shows a schematic cross section through a BOC-package provided with a prepreg layer on a substrate according to the invention.

According to FIG. 1, the BOC (Board On Chip) package 1 includes a substrate 2 with contact pads 3 on one of its sides. The contact pads 3 are part of a not shown wiring on the substrate 2. The wiring is normally made of copper by a previous process. On the side opposite to the contact pads 3, a chip 4 is mounted with a die attach 5 between the substrate surface and the lower surface (active side of the chip) of the chip 4.

The chip 4 of this embodiment is provided with a central row of contact pads (not shown) which are connected via wire loops 6 with pads 7 on the substrate 2 on the contact pad side through a bond channel 8 in the substrate 2. One embodiment that often uses central row of chips as a memory device such as DRAM.

The contact pad side of the substrate 2 is covered by a prepreg layer 9, which is provided with openings 10. Each opening 10 is arranged in such a manner that the contact pads 3 are freely accessible. Solder balls 11 are mounted on each of the contact pads 3 through the openings 10. The prepreg layer 9 is also provided with a central opening 12 over the bond channel 8.

In the preferred embodiments of the openings 12 in the prepreg layer 9, can have a v-shaped cross section with the result that the solder balls 11 can be assembled more easily. In embodiments where the diameter of the openings 12 in the prepreg layer 9 is smaller than the diameter of the contact pads 3, the prepreg layer 9 secures the contact pads 3 on the substrate 2. The openings 12 in the substrate 2 can have a circular or an angular circumference, as an example.

Furthermore, the prepreg layer 9 can be attached to the substrate 2 by laminating and can be made of the same material as the substrate 2. Such a material can be a glass fibre fixed with an epoxy resist like a PCB.

Figure 2:
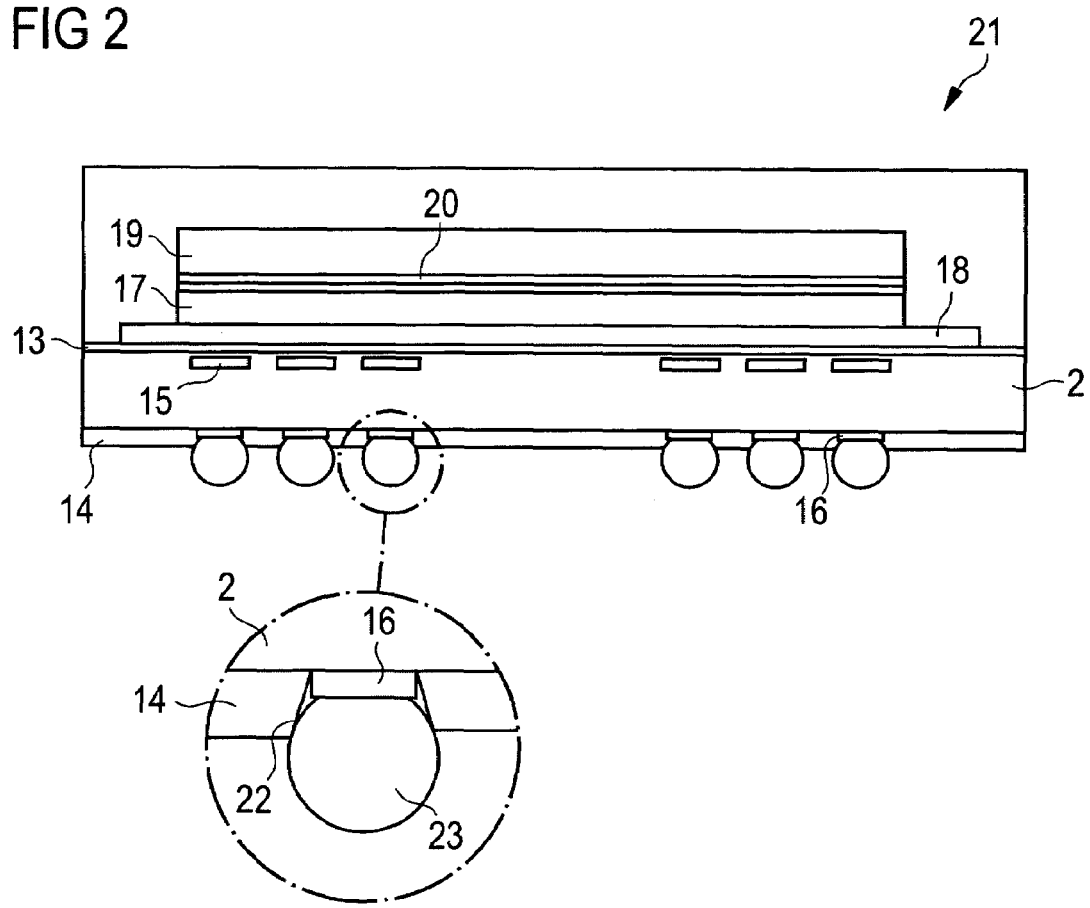
FIG. 2 shows a schematic cross section through a MCP substrate with prepreg layers on both sides of a prepreg layer.

It is also possible to laminate prepreg layers 13, 14 on both sides of the substrate 2 as shown in FIG. 2. This reduces the warpage of the matrix strip (substrate), as well as the warpage of the package. According to FIG. 2, the substrate 2 is provided with a wiring on both its sides, only the contact pads 15 and 16 as part of the respective wiring are shown. The contact pads 13 are connected with respective contact elements (not shown) of a chip 17, which is bonded on the prepreg layer 13 by die bonding with a die attach 18.

The backside of chip 17 can be used as a base for mounting a second chip 19 on it by die bonding with a further die attach 20. The die attach can be a resist or an adhesive tape. The stack of chips 17, 19 is enclosed by a mold compound 21.

The ball side of the substrate 2 is covered by the prepreg layer 14, which is provided with openings 22. Each opening 22 is arranged in such a manner that the contact pads 16 are freely accessible. Solder balls 23 are mounted on each of the contact pads 16 through the openings 22.

In both embodiments, the solder resist known from the prior art is substituted by the prepreg layer 9, 14 with the result of a lower water uptake. Also, packages like the multi-die (which need coverage of the elevated lines on chip side) can be produced without solder mask and the pre-bake process within the assembly can be skipped.

Very good height control of the Prepreg layer 9, 13, 14 guarantees a stable bond line thickness and a better adhesion of the mold compound to the prepreg surface, than to the solder mask.

A general process flow is possible for all products, without adjustments to the individual product.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor component, comprising:
   a substrate that includes a wiring on a first surface;
   a chip mounted on a second surface of the substrate by a die attach, the second surface opposite the first surface;
   a bond channel in the center of the substrate to allow for electrical connection of contact pads on the wiring with bond pads arranged in a center row on the chip by wire loops;
   a housing made of a mold compound surrounding a backside of the chip and parts of the substrate adjacent to the wiring;
   a rigid prepreg layer covering
   the wiring of the substrate, the prepreg layer being provided with openings, each opening arranged in such a manner that the contact pads are accessible; and
   solder balls mounted on each of the contact pads through the openings.

2. The semiconductor component according to claim 1, wherein each opening has a v-shaped cross section.

3. The semiconductor component according to claim 1, wherein the openings each have a first diameter and the contact pads each have a second diameter and wherein the first diameter is smaller than the second diameter.

4. The semiconductor component according to claim 1, wherein each opening has a circular circumference.

5. The semiconductor component according to claim 1, wherein each opening has an angular circumference.

6. The semiconductor component according to claim 1, wherein the prepreg layer is attached to the substrate by laminating.

7. The semiconductor component according to claim 6, wherein the prepreg layer is formed from the same material as the substrate.

8. The semiconductor component according to claim 7, wherein the prepreg layer is formed from glass fibre fixed with an epoxy resist.

9. The semiconductor component according to claim 1, further comprising a second prepreg layer covering the second surface of the substrate.

10. The semiconductor component according to claim 9, wherein the second prepreg layer is laminated on the second surface of the substrate.

11. A semiconductor component, comprising:
    a substrate provided with a first wiring on a first surface and a second wiring on a second surface;
    at least one chip mounted on the first surface of the substrate, the chip being electrically and mechanically connected with contact pads on the second surface on the wiring by flip-chip bonding, and
    a housing made of a mold compound surrounding the backside of the chip and parts of the substrate adjacent to the wiring;
    a first prepreg layer covering the first wiring on the first surface of the substrate;
    a second prepreg layer covering the second wiring on the second surface of the substrate wherein the second prepreg layer is provided with openings, each opening arranged in such a manner that the contact pads on the second surface are freely accessible; and solder balls mounted on each of the contact pads on the first surface through the openings.

12. The semiconductor component according to claim 11, wherein each opening has a v-shaped cross section.

13. The semiconductor component according to claim 11, wherein a diameter of the openings is smaller than a diameter of the contact pads.

14. The semiconductor component according to claim 11, wherein each opening has a circular circumference.

15. The semiconductor component according to claim 11, wherein each opening has an angular circumference.

16. The semiconductor component according to claim 11, wherein the first prepreg layer and the second prepreg layer are attached to the substrate by laminating.

17. The semiconductor component according to claim 16, wherein the prepreg layer is formed from the same material as the substrate.

18. The semiconductor component according to claim 17, wherein the first and second prepreg layers are formed from glass fibre fixed with an epoxy resist.

19. The semiconductor component according to claim 11, wherein the at least one chip comprises a stack of chips mounted on the substrate, the component further including a redistribution layer between each of the chips.

20. The semiconductor component according to claim 19, wherein each of the chips comprises a memory chip.

* * * * *